(12) United States Patent
Kartal et al.

(10) Patent No.: US 6,815,793 B2
(45) Date of Patent: Nov. 9, 2004

(54) BODY OF A SEMICONDUCTOR MATERIAL WITH A REDUCED MEAN FREE PATH LENGTH

(75) Inventors: Veli Kartal, München (DE); Hans-Joachim Schulze, Ottobrunn (DE)

(73) Assignee: Eupec Europdische Gesellschaft fur Leitungshalbleiter GmbH & Co. KG, Warstein-Belecke (DE)

(*) Notice: Subject to any disclaimer, the term of this patent is extended or adjusted under 35 U.S.C. 154(b) by 0 days.

(21) Appl. No.: 10/377,071

(22) Filed: Feb. 28, 2003

(65) Prior Publication Data

US 2003/0137027 A1 Jul. 24, 2003

Related U.S. Application Data

(63) Continuation of application No. PCT/EP01/10751, filed on Sep. 17, 2001.

(30) Foreign Application Priority Data

Sep. 29, 2000 (DE) .......................................... 100 48 345

(51) Int. Cl.[7] .............................................. H01L 29/72
(52) U.S. Cl. ........................ 257/487; 257/488; 257/490; 257/494
(58) Field of Search ............................. 257/487, 488, 257/490, 494

(56) References Cited

U.S. PATENT DOCUMENTS

| | | | |
|---|---|---|---|
| 4,259,683 A | 3/1981 | Adler et al. .................. | 357/64 |
| 5,032,540 A | 7/1991 | Follegot ..................... | 437/142 |
| 5,151,766 A | 9/1992 | Huppi .......................... | 437/24 |
| 5,527,724 A | 6/1996 | Brady et al. .................. | 437/24 |
| 6,479,876 B1 | 11/2002 | Deboy et al. ............... | 257/401 |

FOREIGN PATENT DOCUMENTS

| | | | | |
|---|---|---|---|---|
| DE | 42 23 914 A1 | 1/1994 | ......... | H01L/21/328 |
| DE | 197 30 759 C1 | 9/1998 | ........... | H01L/29/78 |
| DE | 100 30 381 A1 | 1/2002 | ........... | H01L/29/70 |
| EP | 0 297 325 A2 | 6/1988 | ........... | H01L/29/74 |
| EP | 0 878 849 A2 * | 11/1988 | ................ | 257/487 |
| EP | 0 398 120 A1 | 5/1990 | ......... | H01L/29/32 |
| EP | 0 709 898 A2 | 10/1995 | ......... | H01L/29/861 |
| EP | 0 797 257 A2 | 3/1997 | ......... | H01L/29/744 |
| EP | 1 014 453 A1 | 8/1997 | ......... | H01L/29/868 |
| EP | 0 837 506 A2 | 10/1997 | ........... | H01L/29/32 |
| EP | 0 878 849 A2 | 5/1998 | ......... | H01L/29/861 |

OTHER PUBLICATIONS

International Search Report; PCT/EP01/10751, Oct. 25, 2002.

* cited by examiner

*Primary Examiner*—Edward Wojciechowicz
(74) *Attorney, Agent, or Firm*—Baker Botts L.L.P.

(57) ABSTRACT

A body (1) consisting of a doped semiconductor material with a pn junction (10) and an area (2) of reduced mean free path length ($\lambda r$) for free charge carriers is disclosed. Said area (2) has sections (21, 22) which succeed each other in at least one specified direction (x, y, z) and between which there is at least one region (23), containing a mean free path length ($\lambda 0$) for the free charge carriers that is larger in relation to the reduced mean free path length ($\lambda r$).

18 Claims, 3 Drawing Sheets

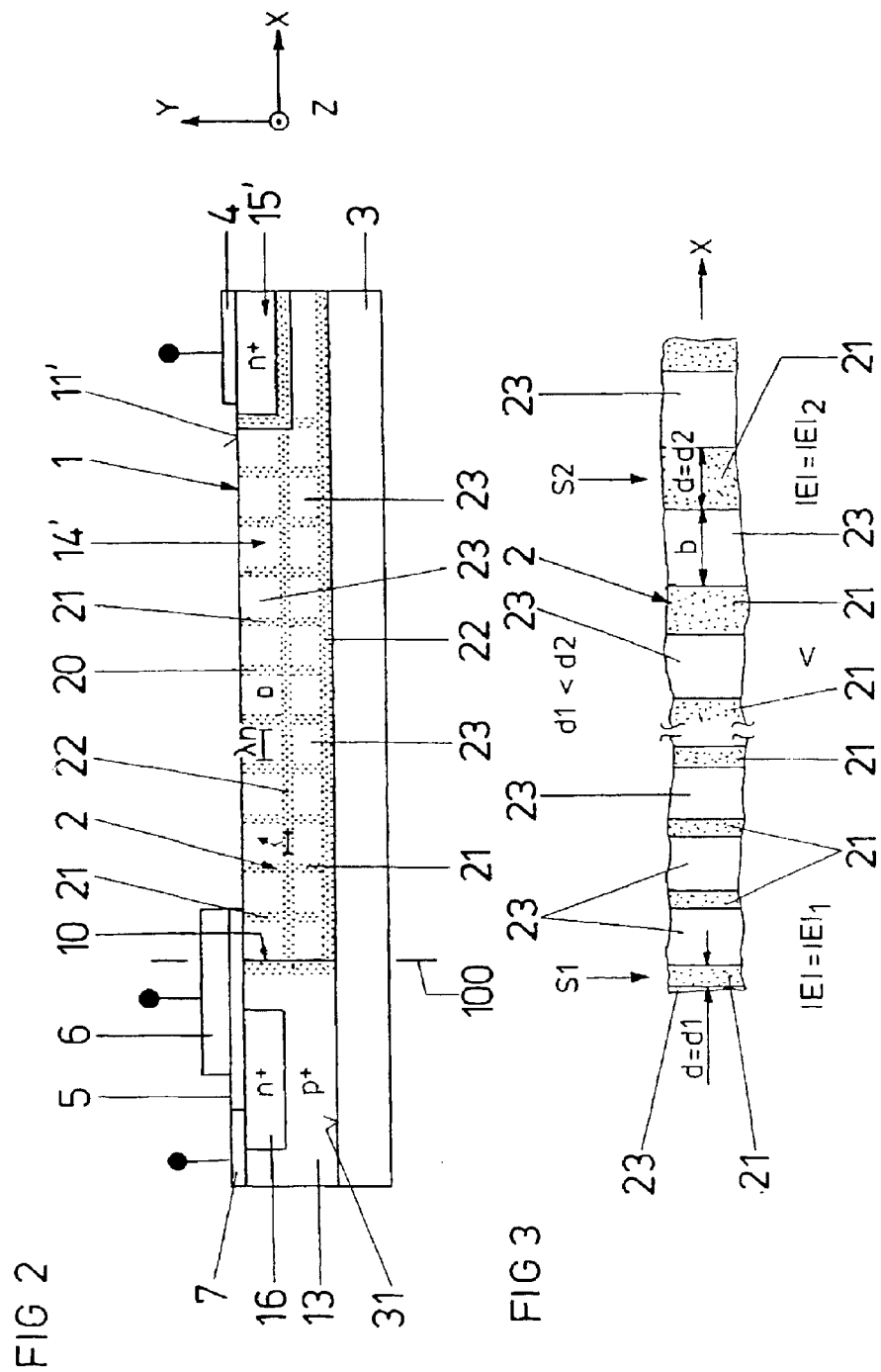

BODY OF A SEMICONDUCTOR MATERIAL WITH A REDUCED MEAN FREE PATH LENGTH

CROSS REFERENCE TO RELATED APPLICATION

This application is a continuation of copending International Application No. PCT/EP01/10751 filed Sep. 17, 2001.

BACKGROUND OF THE INVENTION

This invention relates to a body made of a doped semiconductor material of at least one type of conduction, having a mean free path length for free charge carriers in the semiconductor material and at least one area where the mean free path length for free charge carriers in the semiconductor material is reduced for the free charge carriers relative to a mean free path length of the semiconductor material.

A body of the aforementioned type is proposed in the older German Patent Application 10030381.1 (2000 P 12486), which was not published previously, the contents of which are part of the disclosure content of the present patent application.

With this proposed body, the doped semiconductor material has different types of doping and also has:

- a junction between one type of conduction and the opposite type of conduction from this type of conduction,
- a mean free path length for free charge carriers in the semiconductor material for each type of conduction, and
- for one of the two types of conduction, it has a region in which there is a mean free path length for the free charge carriers in the semiconductor material which is reduced relative to the mean free path length for the free charge carriers of the semiconductor material of this type of conduction.

The area of reduced mean free path length for the free charge carriers in the semiconductor material leads in general to better electrical properties of the body of semiconductor material. Thus, in the case of the body already proposed, a high electric breakdown strength is achieved due to this area.

SUMMARY OF THE INVENTION

The object of this invention is to provide a body of the type defined in the preamble which has even better electric properties.

This object can be achieved by a body of doped semiconductor material of at least one conduction type, which has a mean free path length for free charge carriers in the semiconductor material and has at least one area in which there is a mean free path length for the free charge carriers in the semiconductor material, this mean free path length being reduced relative to a mean free path length of the semiconductor material for the free charge carriers, whereby the area of reduced mean free path length has sections which follow one another in at least one certain direction and between which there is at least one region in which a greater mean free path length prevails relative to the reduced mean free path length for the free charge carriers in the semiconductor material.

It is essential with this embodiment that the area of reduced mean free path length has sections which follow one another in at least one certain direction and between which there is at least one region for which free charge carriers are predominant in the semiconductor material.

Accordingly, with the body according to this invention, the area of reduced mean free path length is not continuous, as is the case with the body proposed in the past, but instead is interrupted by at least one region having a greater mean free path length relative to this path length. Therefore, in the area of reduced mean free path length, production of charge carriers by ionization due to collision is hindered by the reduced free path length of the charge carriers.

In the region(s) in which the greater mean free path length for the free charge carriers in the semiconductor material is predominant relative to the reduced mean free path length, this is accomplished by the geometry of each region. The charge carriers need a certain path length to be able to absorb enough energy on the basis of this so that they can themselves generate additional charge carriers by ionization due to collision. If this path length is kept small, then these charge carriers cannot take up enough energy.

In the case of the body according to this invention, measures are taken to ensure to advantage not only that an electric current flows in an area of reduced mean free path length but also that the current flows in at least one region where the mean free path length is greater than the reduced mean free path length.

Therefore, with the body according to this invention, it is possible to advantage to implement a component with a body made of a semiconductor material in which the free path length of the charge carriers need not be reduced everywhere that a high electric field strength prevails.

With the body according to this invention, its electric conduction property is improved in comparison with that of the body having the continuous area of reduced mean free path length as was customary in the past.

An advantageous embodiment of the body according to this invention is designed such that there is a distance between adjacent regions having a greater mean free path length relative to the reduced mean free path length, these regions being separated by a section of the area of reduced mean free path length which determines this distance, which depends on the absolute value of an electric field strength generated by applying a certain electric voltage to the body in the semiconductor material, such that this distance decreases at a location of a lower absolute value and increases at a location of a greater absolute value. For example, this may mean that such regions are arranged in a greater density in areas where the absolute value of the electric field strength is lower, and such regions are arranged in a lower density in areas where the absolute value of the electric field strength is higher.

Another advantageous embodiment of the body according to this invention is designed so that a distance between adjacent sections of the area of reduced mean free path length, separated by a region with a greater mean free path length relative to the reduced mean free path length, depends on the absolute value of an electric field strength generated by applying a certain electric voltage to the body in the semiconductor material such that this distance is greater at a location of a smaller absolute value and is smaller at a location of a greater absolute value. For example, this may mean that such sections are arranged in a greater density in areas where the absolute value of the electric field strength is greater and they are arranged in a lower density in areas where the absolute value of the electric field strength is lower.

These two embodiments may be combined.

In a preferred and advantageous manner, the relative greater mean free path length of a region is equal to the mean free path length of the doped semiconductor material of the one type of conduction outside of the area of reduced mean free path length.

An especially preferred and advantageous embodiment of the body according to this invention is designed like the body already proposed, so that the doped semiconductor material has different types of doping and has at least one junction between one type of conduction and a type of conduction opposite this former type of conduction, has a mean free path length for free charge carriers in the semiconductor material for each type of conduction and has for at least one of the two types of conduction an area in which there is mean free path length for the free charge carriers in the semiconductor material which is reduced relative to the mean free path length for the free charge carriers of the semiconductor material of this one type of conduction, whereby the area of reduced mean free path length has at least two sections which follow one another in the direction perpendicular to a surface in which the junction extends and between which there is a region where a greater mean free path length for the free charge carriers in the semiconductor material prevails relative to the reduced mean free path length, and/or whereby the area of reduced mean free path length has as least two sections which follow one another in at least one direction parallel to the surface in which the junction extends and between which there is a region in which a greater mean free path length for the free charge carriers in the semiconductor material prevails relative to the reduced mean free path length.

On the one hand, a high blocking voltage may be applied at the junction in an advantageous embodiment, while on the other hand, the electric conduction property of the junction is improved.

In a preferred and advantageous design of the advantageous embodiment, there is a distance between adjacent regions which are separated by a section of the area of reduced mean free path length, this distance depending on the absolute value of an electric field strength generated by applying a certain electric blocking voltage to the junction in the semiconductor material such that this distance is greater at a location of a smaller absolute value and is smaller at a location of a greater absolute value.

With the body design according to this invention, in particular in its advantage embodiment, a high voltage component can be implemented to advantage with a body of a semiconductor material, which has low forward power losses and switching losses but on the other hand also has a small component volume. It is thus possible to implement both a high voltage component with a small volume as well as a high-voltage IC (HVIC) of extremely high integration.

High-voltage components are implemented today essentially through the choice of the lowest possible base doping in an n-doped base of its body of semiconductor material. However, there are limits to this measure from the standpoint of the lowest possible total power loss in the component, because reducing the base doping usually also results in an increased component thickness. HVICs are implemented either in junction isolation technology (JI technology) or in dielectric isolation technology (DI technology). Both technologies require a "thick" drift zone to be able to accommodate the required blocking voltage.

With the body design according to this invention, it is possible to implement, for example, an electric resistor in addition to a thyristor, a transistor or a power MOSFET HVIC.

BRIEF DESCRIPTION OF THE DRAWINGS

This invention is explained in greater detail in the following description on the basis of the drawings as examples; they show:

FIG. 3 a detail of an area of a reduced mean free path length of a body design according to this invention having regions of a relatively greater mean free path length having different distances from one another, and FIG. 4 a detail of an area of reduced mean free path length of a body design according to this invention with sections of this area being different distances from one another.

The figures are schematic and are not drawn to scale.

DETAILED DESCRIPTION OF THE PREFERRED EMBODIMENTS

Figure 1:
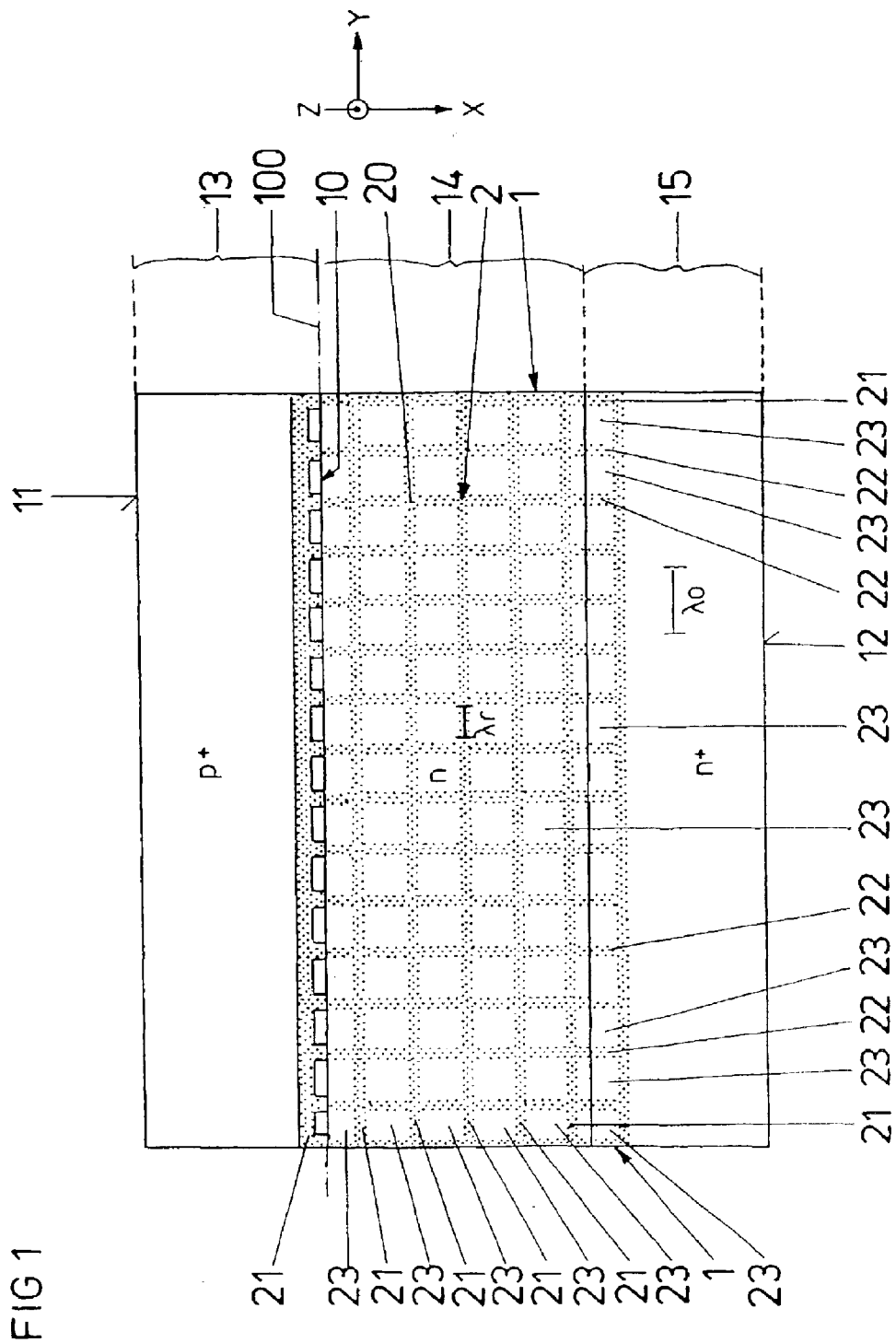
FIG. 1 a cross section through a highly blocking diode formed with a body design according to this invention perpendicular to the surface of a pn junction of the body, and FIG. 2 a cross section through a high-voltage MOS component formed with a body design according to this invention perpendicular to the surface of a pn junction of the body.

In FIGS. 1 and 2 the body of doped semiconductor material is labeled as 1 in general and the area of reduced mean free path length is labeled as 2 in general.

Area 2 is in both cases situated essentially only in the n-doped semiconductor material of body 1, i.e., in the semiconductor material of conduction type n. This means essentially that in many cases it is expedient to expand area 2 in the semiconductor material of conduction type p of body 1, which has a high electric field strength, e.g., as indicated in FIGS. 1 and 2.

A mean free path length $\lambda 0$ for free charge carriers prevailed in the n-doped semiconductor material in which area 2 essentially extends.

In part 20 of area 2, which is indicated with dotted lines and hatching, the prevailing mean free path length $\lambda r$ for the free charge carriers in the n-doped semiconductor material is reduced relative to the given mean free path length $\lambda 0$ of this semiconductor material.

According to this invention, area 2 of reduced mean free path length $\lambda r$ has sections which follow one another in at least one certain direction and between which there is at least one region in which a greater mean free path length for the free charge carriers in the semiconductor material prevails relative to the reduced mean free path length $\lambda r$.

For example, in FIGS. 1 and 2, several sections 21 of area 2 follow one another in direction x, the reduced mean free path length $\lambda r$ prevailing in these sections, and regions 23 being provided between them, where the prevailing mean free path length for the free charge carriers in the semiconductor material, e.g., the given greater path length $\lambda 0$, is greater than the reduced mean free path length In the direction y perpendicular to direction x, there also follow, for example, sections 22 of area 2 in which the reduced mean free path length $\lambda r$ is predominant and between which there are regions 23 in which the prevailing mean free path length for the free charge carriers in the semiconductor material, e.g., the given greater path length $\lambda 0$, is greater than the reduced mean free path length $\lambda r$.

A similar condition may also prevail in direction z which is perpendicular to directions x and y and to the plane of the drawings in the figures.

In particular, FIGS. 1 and 2, for example, show each region 23 completely surrounded by sections 21 and 22 of area 2, and moreover, regions 22 in particular are arranged in rows and columns in the form of a matrix in directions x and y. Each section 21 extends in direction y through the entire area 2, each section 22 extends in direction x through the entire area 2 and sections 21 and 22 intersect and enclose regions 23 between them.

In the example of body 1 according to FIGS. 1 and 2, the doped semiconductor material is doped by the opposite type of conduction p and n, i.e., it is p-doped and n-doped, and has a pn junction 10 which extends in an area 100 perpendicular to the plane of the drawing in these figures.

For each type of conduction p and/or n, the semiconductor material has a given mean free path length $\lambda 0$ for free charge carriers in the semiconductor material.

Area 2 of the reduced mean free path length $\lambda r$ extends essentially only in the n-doped semiconductor material and is adjacent at least to the pn junction 10 of body 1.

Direction x in which sections 21 follow one another and between which regions 23 are present stands for example perpendicular to area 100 in which the pn junction 10 extends.

In addition, the direction y in which sections 22 follow one another and between which regions 23 are present is, for example, parallel to the surface 100 in which the pn junction 10 extends. A similar situation may also apply to the direction z which also runs parallel to surface 100 where the pn junction extends.

Body 1 according to FIG. 1 is that of a highly blocking diode. This body 1, whose semiconductor material is silicone, for example, has a p+-doped area 13, which is adjacent to a surface section 11 of this body and is contacted by a terminal electrode (not shown) of the diode which is arranged on this surface section 11; it also has on the side of area 13 facing away from surface section 11 an n-doped area 14 adjacent to this area 13 and on the side of area 14 facing away from surface section 11 it has an n+-doped area 15 which is adjacent to this area 14 and is also adjacent to a surface section 12 of body 1 which faces away from surface section 11 and is contacted by a terminal electrode (not shown) of the diode arranged on the surface section 12.

The interface between the p+-doped area 13 and the n-doped area 14 is surface 100 in which the pn junction 10 of the diode extends.

Area 2 which has sections 21 and 22 as well as regions 23 and is an area of reduced mean free path lengths extends essentially only over the n-doped area 14, i.e., it generally projects only slightly into the p+-doped area 13 and/or into the n+-doped area 15. With respect to this extend and the other provisions of area 2, see also the discussion in this regard in the older German Patent Application 10030381.1, which is also applicable here.

Body 1 according to FIG. 2 is that of a high voltage MOS component. This body 1, which may also be made of silicon, for example is arranged on the surface 31 of a substrate 3 of electrically insulating material, e.g., SiO2. The pn junction 10 of this body 1 extends in the surface 100, which is perpendicular to the surface 31 of substrate 3 and separates a left p+-doped area 13' of body 1 from a right n-doped area 14' of body 1. Both the p+-doped area 13' and n-doped area 14' are adjacent to a surface section 11' of body 1, which faces away from substrate 3.

In the n-doped area 14' there is arranged at a distance from the pn junction 10 an n+-doped area 15' which is adjacent to the surface section 11' of body 1 and is contacted by a drain electrode 14 of the component situated on the surface section 11'.

An n+-doped area 16, which is adjacent to surface section 11' of body 1, is arranged at a distance from the pn junction 10 in the p+-doped area 13'.

A layer 5 of electrically insulating material is arranged over the pn junction 10 on the surface section 11' of the body 1, extending from the n-doped area 14' over the p+-doped area 13' into the n+-doped area 16 and covering only a portion of area 13' and area 16.

A gate electrode 6 of the component is arranged on layer 5 made of an electrically insulating material, over the pn junction 10, also extending from the n-doped area 14' over the p+-doped area 13' into the n+-doped area 16.

The uncovered portions of area 13' and area 16 are contacted jointly by a source electrode 7 of the component arranged on the surface section 11' of body 1.

The interface between the p+-doped area and the n-doped area 14 forms the surface 100 in which the pn junction 10 of the diode extends.

The area 2 of a reduced mean free path length $\lambda r$ having sections 21 and 22 of a reduced mean free path length $\lambda r$ as well as regions 23 with a greater mean free path length relative to the reduced mean free path length $\lambda r$ extends essentially only over the n-doped area 14', i.e., in general it projects only slightly into the p+-doped area 13' and/or into the n+-doped area 15'. With regard to this extent and the other provisions of area 2, see also the discussion in the older German Patent Application 10030381.1, which is also applicable here.

FIG. 3 shows a detail from an area 2 of a reduced mean free path length of a body 1 according to this invention, as illustrated in the sectional diagram according to FIGS. 1 and 2.

In this area 2, sections 21 of area 2, in which the reduced mean free path length $\lambda r$ prevails, follow one another in direction x, and between these sections 21 there are regions 23 in which a mean free path length which is greater than the reduced mean free path length $\lambda r$ prevails for the free charge carriers in the n-doped semiconductor material, e.g., the given greater path length $\lambda 0$. In this area 2, there is a distance between adjacent regions 23 having a greater mean free path length relative to the reduced mean free path length $\lambda r$, these regions being separated by a section 21 of the area 2 of a reduced mean free path length $\lambda r$, and which section 21 determines this distance by its extent d in direction x, this distance depending on the absolute value |E| of an electric field strength E generated by applying a certain electric voltage to the body 1 in the semiconductor material, such that this distance d is smaller at a location of a smaller absolute value |E| and is greater at a location of a greater absolute value |E|.

For example, let us assume that the value |E|1 prevails at the left location S1 in FIG. 3, and the value |E|2 of the absolute value |E| of the electric field strength E prevails at the right location S2, where |E|1 is smaller than |E|2. Accordingly, at the left location S1, the distance d has a value d1 which is smaller than the value d2 of the distance d at the right location S2.

For example, this may mean that such regions 23 are arranged in a greater density in locations where the absolute value |E| of the electric field strength E is smaller, and these regions are arranged in a lower density in areas where the absolute value |E| of the electric field strength E is greater.

The extent b of each region 23 in direction x may be the same or different for several or all of regions 23.

Figure 4:
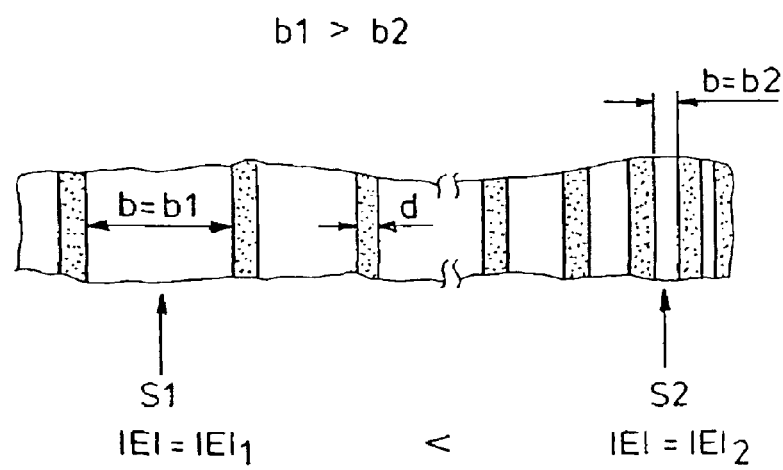

FIG. 4 shows a detail of an area 2 of a reduced mean free path length of a body 1 according to this invention in a sectional diagram according to FIGS. 1 and 2. In this area, sections 21 of area 2, in which the reduced mean free path length λr prevails, follow one another in direction x, and between these sections 21 there are regions 23 in which a greater mean free path length relative to the reduced mean free path length λr prevails for the free charge carriers in the n-doped semiconductor material, e.g., the given greater path length λ0.

In FIG. 4 there is a distance between adjacent sections 21 of area 2 of a reduced mean free path length λr, which are separated by a region 23 having a greater mean free path length relative to the reduced mean free path length λr, and which region 23 determines this distance by its extent b in direction x, this distance depending on the absolute value |E| of an electric field strength E generated by applying a certain electric voltage to the body in the semiconductor material such that this distance b is greater at a location of a smaller absolute value |E| and is smaller at a location of a greater absolute value |E|.

For example, let us assume that the value |E|1 prevails at the left location S1 in FIG. 4 and the value |E|2 of the absolute value |E| of the electric field strength E at the right location S2, where |E|1 is again considered as being less than |E|1 [sic; |E|2]. Accordingly, the distance b at the left location S1 has a value b1, which is greater than value b2 of the distance b at the right location S2.

For example, this can mean that such sections 21 are arranged in greater density where the absolute value |E| of the electric field strength E is greater, and they are arranged in a lower density in areas where the absolute value |E| of the electric field strength E is smaller.

The extent d of each section 21 in direction x may be the same or different for several sections or for all sections 21.

What is claimed is:

1. A body of doped semiconductor material of at least one conduction type, which has a mean free path length for free charge carriers in the semiconductor material and has at least one area in which there is a mean free path length for the free charge carriers in the semiconductor material, this mean free path length being reduced relative to a mean free path length of the semiconductor material for the free charge carriers, whereby the area of reduced mean free path length has sections which follow one another in at least one certain direction and between which there is at least one region in which a greater mean free path length prevails relative to the reduced mean free path length for the free charge carriers in the semiconductor material, and whereby there is a distance between adjacent regions having a greater mean free path length relative to the reduced mean free path length, these regions being separated by a section of the area of reduced mean free path length which determines this distance, which depends on the absolute value of an electric field strength generated by applying a certain electric voltage to the body in the semiconductor material, this distance being smaller at a location of a lower absolute value and greater at a location of a higher absolute value.

2. The body according to claim 1, whereby the is a distance between adjacent sections of the area of a reduced mean free path length which are separated by a region which determines this distance and has a greater mean free path length in comparison with the reduced mean free path length, this distance depending on the absolute value of an electric field strength generated by applying a certain electric voltage to the body and the semiconductor material, such that this distance is greater at a location of a smaller absolute value and is smaller at a location of a greater absolute value.

3. The body according to claim 1, whereby the relatively greater mean free path length of a region is equal to the mean free path length of the semiconductor material of the one type of conduction outside of the area of the reduced mean free path length.

4. The body according to claim 1, whereby the doped semiconductor material has different types of doping and it has at least one junction between one type of conduction and a type of conduction opposite this type of conduction;

for each type of conduction, it has a mean free path length for free charge carriers in the semiconductor material, and for at least one of the two types of conduction, it has an area in which there is a mean free path length for the free charge carriers in the semiconductor material which is reduced relative to the mean free path length for the free charge carriers of the semiconductor material of this type of conduction;

whereby the area of reduced mean free path length has sections which extend in a direction perpendicular to a surface in which the junction extends and between which there is at least one region in which a greater mean free path length for the free charge carriers prevails relative to the reduced mean free path length, and whereby the area of reduced mean free path length has sections which follow one another in at least one direction parallel to the surface in which the junction extends and between which there is at least one region in which the prevailing mean free path length for the free charge carriers is greater than the reduced mean free path length.

5. The body according to claim 1, whereby the doped semiconductor material has different types of doping and it has at least one junction between one type of conduction and a type of conduction opposite this type of conduction;

for each type of conduction, it has a mean free path length for free charge carriers in the semiconductor material, and for at least one of the two types of conduction, it has an area in which there is a mean free path length for the free charge carriers in the semiconductor material which is reduced relative to the mean free path length for the free charge carriers of the semiconductor material of this type of conduction;

whereby the area of reduced mean free path length has sections which extend in a direction perpendicular to a surface in which the junction extends and between which there is at least one region in which a greater mean free path length for the free charge carriers prevails relative to the reduced mean free path length.

6. The body according to claim 1, whereby the doped semiconductor material has different types of doping and it has at least one junction between one type of conduction and a type of conduction opposite this type of conduction;

for each type of conduction, it has a mean free path length for free charge carriers in the semiconductor material, and for at least one of the two types of conduction, it has an area in which there is a mean free path length for the free charge carriers in the semiconductor material which is reduced relative to the mean free path length for the free charge carriers of the semiconductor material of this type of conduction;

whereby the area of reduced mean free path length has sections which follow one another in at least one direction parallel to the surface in which the junction extends and between which there is at least one region in which the prevailing mean free path length for the free charge carriers is greater than the reduced mean free path length.

7. The body according to claim 5, whereby there is a distance between adjacent regions having a greater mean free path length relative to the reduced mean free path length, separated by a section of the area of reduced mean free path length which determines this distance, which depends on the absolute value of an electric field strength generated by applying a certain electric blocking voltage to the junction in the semiconductor material such that this distance is smaller at a location where the absolute value of the electric field strength is lower and is greater at a location where the absolute value is higher.

8. The body according to claim 5, whereby there is a distance between adjacent sections of the area of reduced mean free path length, these sections being separated by a region which determines this distance and has a greater mean free path length relative to the reduced mean free path length, this distance depending on the absolute value of an electric field strength generated by applying a certain electric blocking voltage to the junction in the semiconductor material such that this distance is greater at a location where the absolute value is lower and is smaller at a location where the absolute value is greater.

9. The body according to claim 7, whereby there is a distance between adjacent sections of the area of reduced mean free path length, these sections being separated by a region which determines this distance and has a greater mean free path length relative to the reduced mean free path length, this distance depending on the absolute value of an electric field strength generated by applying a certain electric blocking voltage to the junction in the semiconductor material such that this distance is greater at a location where the absolute value is lower and is smaller at a location where the absolute value is greater.

10. A semiconductor device having a body of doped semiconductor material of at least one conduction type, comprising:
   a mean free path length for free charge carriers in the semiconductor material and
   at least one area in which there is a mean free path length for the free charge carriers in the semiconductor material, wherein the mean free path length is reduced relative to a mean free path length of the semiconductor material for the free charge carriers,
   whereby the area of reduced mean free path length has sections which follow one another in at least one certain direction and between which there is at least one region in which a greater mean free path length prevails relative to the reduced mean free path length for the free charge carriers in the semiconductor material, and
   whereby there is a distance between adjacent sections of the area of a reduced mean free path length which are separated by a region which determines this distance and has a greater mean free path length in comparison with the reduced mean free path length, this distance depending on the absolute value of an electric field strength generated by applying a certain electric voltage to the body and the semiconductor material, such that this distance is greater at a location of a smaller absolute value and is smaller at a location of a greater absolute value.

11. The device according to claim 10, whereby there is a distance between adjacent regions having a greater mean free path length relative to the reduced mean free path length, these regions being separated by a section of the area of reduced mean free path length which determines this distance, which depends on the absolute value of electric field strength generated by applying a certain electric voltage to the body in the semiconductor material, this distance being smaller at a location of a lower absolute value and greater at a location of a higher absolute value.

12. The device according to claim 10, whereby the relatively greater mean free path length of a region is equal to the mean free path length of the semiconductor material of the one type of conduction outside of the area of the reduced mean free path length.

13. The device according to claim 10, whereby the doped semiconductor material has different types of doping and
   it has at least one junction between one type of conduction and a type of conduction opposite this type of conduction;
   for each type of conduction, it has a mean free path length for free charge carriers in the semiconductor material, and
   for at least one of the two types of conduction, it has an area in which there is a mean free path length for the free charge carriers in the semiconductor material which is reduced relative to the mean free path length for the free charge carriers of the semiconductor material of this type of conduction;
   whereby the area of reduced mean free path length has sections which extend in a direction perpendicular to a surface in which the junction extends and between which there is at least one region in which a greater mean free path length for the free charge carriers prevails relative to the reduced mean free path length, and
   whereby the area of reduced mean free path length has sections which follow one another in at least one direction parallel to the surface in which the junction extends and between which there is at least one region in which the prevailing mean free path length for the free charge carriers is greater than the reduced mean free path length.

14. The device according to claim 10, whereby the doped semiconductor material has different types of doping and
   it has at least one junction between one type of conduction and a type of conduction opposite this type of conduction;
   for each type of conduction, it has a mean free path length for free charge carriers in the semiconductor material, and
   for at least one of the two types of conduction, it has an area in which there is a mean free path length for the free charge carriers in the semiconductor material which is reduced relative to the mean free path length for the free charge carriers of the semiconductor material of this type of conduction;
   whereby the area of reduced mean free path length has sections which extend in a direction perpendicular to a surface in which the junction extends and between which there is at least one region in which a greater mean free path length for the free charge carriers prevails relative to the reduced mean free path length.

15. The device according to claim 10, whereby the doped semiconductor material has different types of doping and it has at least one junction between one type of conduction and a type of conduction opposite this type of conduction;

for each type of conduction, it has a mean free path length for free charge carriers in the semiconductor material, and for at least one of the two types of conduction, it has an area in which there is a mean free path length for the free charge carriers in the semiconductor material which is reduced relative to the mean free path length for the free charge carriers of the semiconductor material of this type of conduction;

whereby the area of reduced mean free path length has sections which follow one another in at least one direction parallel to the surface in which the junction extends and between which there is at least one region in which the prevailing mean free path length for the free charge carriers is greater than the reduced mean free path length.

16. The device according to claim 15, whereby there is a distance between adjacent regions having a greater mean free path length relative to the reduced mean free path length, separated by a section of the area of reduced mean free path length which determines this distance, which depends on the absolute value of an electric field strength generated by applying a certain electric blocking voltage to the junction in the semiconductor material such that this distance is smaller at a location where the absolute value of the electric field strength is lower and is greater at a location where the absolute value is higher.

17. The device according to claim 15, whereby there is a distance between adjacent sections of the area of reduced mean free path length, these sections being separated by a region which determines this distance and has a greater mean free path length relative to the reduced mean free path length, this distance depending on the absolute value of an electric field strength generated by applying a certain electric blocking voltage to the junction in the semiconductor material such that this distance is greater at a location where the absolute value is lower and is smaller at a location where the absolute value is greater.

18. The device according to claim 16, whereby there is a distance between adjacent sections of the area of reduced mean free path length, these sections being separated by a region which determines this distance and has a greater mean free path length relative to the reduced mean free path length, this distance depending on the absolute value of an electric field strength generated by applying a certain electric blocking voltage to the junction in the semiconductor material such that this distance is greater at a location where the absolute value is lower and is smaller at a location where the absolute value is greater.

* * * * *